United States Patent
Keller

(10) Patent No.: US 8,642,925 B2
(45) Date of Patent: Feb. 4, 2014

(54) HEATING DEVICE FOR TESTING INTEGRATED COMPONENTS

(75) Inventor: Robert Keller, Munich (DE)

(73) Assignee: Infineon Technologies AG, Neubiberg (DE)

( * ) Notice: Subject to any disclaimer, the term of this patent is extended or adjusted under 35 U.S.C. 154(b) by 1324 days.

(21) Appl. No.: 11/671,682

(22) Filed: Feb. 6, 2007

(65) Prior Publication Data

US 2007/0187390 A1 Aug. 16, 2007

(30) Foreign Application Priority Data

Feb. 6, 2006 (DE) .................. 10 2006 005 319

(51) Int. Cl.
*H05B 1/00* (2006.01)

(52) U.S. Cl.
USPC .................. 219/201; 324/750.24; 324/750.25

(58) Field of Classification Search
USPC ............... 219/201, 209, 391, 407; 324/158.1, 324/760, 765, 750.24, 750.25, 754.14
See application file for complete search history.

(56) References Cited

U.S. PATENT DOCUMENTS

| | | | | |
|---|---|---|---|---|
| 3,170,060 A | * | 2/1965 | McKimmy et al. | 219/390 |
| 3,412,234 A | * | 11/1968 | Otavka | 219/406 |
| 5,172,049 A | * | 12/1992 | Kiyokawa et al. | 324/750.03 |
| 5,528,159 A | * | 6/1996 | Charlton et al. | 324/750.25 |
| 5,528,161 A | * | 6/1996 | Liken et al. | 324/760 |
| 5,766,979 A | * | 6/1998 | Budnaitis | 438/15 |
| 5,886,535 A | * | 3/1999 | Budnaitis | 324/756.05 |
| 5,911,897 A | * | 6/1999 | Hamilton | 219/497 |
| 5,969,537 A | * | 10/1999 | Kanno et al. | 324/750.03 |
| 6,019,166 A | * | 2/2000 | Viswanath et al. | 165/80.4 |
| 6,104,204 A | * | 8/2000 | Hayama et al. | 324/750.08 |
| 6,288,371 B1 | * | 9/2001 | Hamilton et al. | 219/530 |
| 6,313,653 B1 | * | 11/2001 | Takahashi et al. | 324/750.06 |
| 6,323,667 B1 | * | 11/2001 | Kazama | 324/761 |
| 6,445,203 B1 | * | 9/2002 | Yamashita et al. | 324/760 |
| 6,488,172 B1 | * | 12/2002 | Wenning et al. | 220/592.02 |
| 6,838,897 B2 | * | 1/2005 | Kim et al. | 324/760 |
| 6,924,635 B2 | * | 8/2005 | Yeh | 324/158.1 |
| 6,972,581 B2 | * | 12/2005 | Yamashita et al. | 324/760 |
| 2003/0153199 A1 | * | 8/2003 | Jiten et al. | 439/68 |
| 2007/0117242 A1 | * | 5/2007 | Haji-Sheikh et al. | 438/42 |

* cited by examiner

*Primary Examiner* — Henry Yuen
*Assistant Examiner* — John Wasaff
(74) *Attorney, Agent, or Firm* — Dicke, Billig & Czaja, PLLC

(57) ABSTRACT

A heating device for testing integrated components is disclosed. In one embodiment, an inner casing is arranged in the heating device surrounding a holding chamber. The inner casing contains at least one recess in which an electrically conductive contact device is moveably arranged. This permits contact to be reliably made with a circuit to be tested. If the inner casing is of compact design, there is a very homogeneous temperature distribution in the heating device.

27 Claims, 3 Drawing Sheets

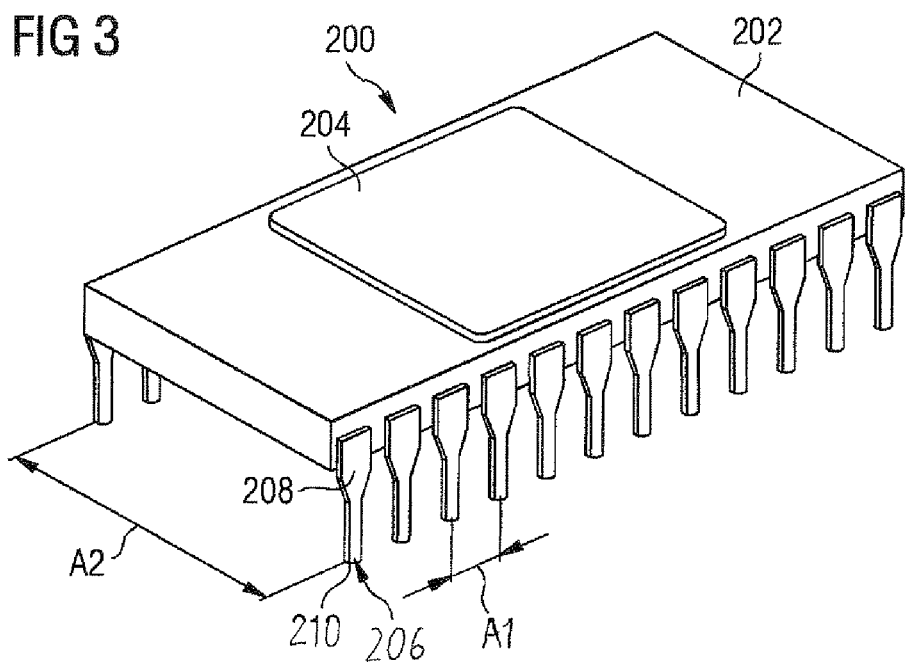

HEATING DEVICE FOR TESTING INTEGRATED COMPONENTS

CROSS-REFERENCE TO RELATED APPLICATIONS

This Utility patent application claims priority to German Patent Application No. DE 10 2006 005 319.2, filed on Feb. 6, 2006, which is incorporated herein by reference.

BACKGROUND

The invention relates to a heating device for testing integrated components, or to a high-temperature test chamber for semiconductor test structures. The heating device contains an inner casing which is arranged in the heating device and which surrounds a holding chamber. Furthermore, the heating device contains a heating element arrangement which itself contains a heat source for heating the holding chamber.

The heating device typically generates the heat from current, for example using heating wires or heating lamps. However, other heating principles are not ruled out. This heating device is used, in particular, for what are referred to as accelerated service life trials on semiconductor test structures in order to obtain definitive information about reliability and durability of technologies on which products are based, i.e. the technology qualification. For this purpose, test structures are operated at temperatures which are raised compared to the operating temperature and/or under electric loads (current/voltage) which are raised compared to normal operation, and the changes in the characteristic variables of the structure are observed. For example, for electromigration tests, a conductor track of a wiring plane of a semiconductor chip is subjected to high temperatures with a high current in an oven and the change in the ohmic resistance over time is measured, for example over days or weeks. Typical test temperatures are in the range from 225° C. to 350° C.

There are a large number of commercial heating devices. The following are differentiated, for example:
- recirculation oven with circuit board which is fitted through the oven wall,
- recirculation oven with circuit board insertion device in the hot region, and oven feedthrough, and
- hotplate system with feedthrough circuit board which is fitted through the oven wall and a heating plate which is located in front of the components.

All these heating devices have printed circuit boards for making contact with the integrated components arranged in the oven. There are printed circuit boards made of various materials, depending on the application temperature, for example ceramic, fiber-bound material or steel enamel. Mechanical and electrical contact is made with the printed circuit board and a base using, for example, spring contacts, press-in contacts, soldered points or conductive adhesive. However, none of these systems operates sufficiently free of faults. As a result, incorrect loading, data which cannot be evaluated and possibly incorrect information occur in some of the trials. The causes of the faults in the oven or heating devices are predominantly located in the associated systems with which the electrical connections between the test specimen and the loading/measuring electronics is established.

Some of the data supplied by the known systems is questionable due to, for example, contact problems and temperature deviations which are not detected. This often subsequent troubleshooting is time consuming. In a typical laboratory with an overall capacity of more than or equal to 3000 module locations, for example two engineers each devote approximately 10 percent of their working time to these problems which arise solely due to inadequacies in the systems. However, these engineers are supposed to test the circuits or component and not the systems. The technical problem with these stress trials is therefore reliable compliance with the desired stress conditions, in particular the temperature, and the correct measurement of the desired electrical parameters. In addition, the systems should be operator friendly, low maintenance and cost effective.

For these and other reasons, there is a need for the present invention.

SUMMARY

One embodiment provides a heating device for testing integrated components, including an inner casing arranged in the heating device, the inner casing surrounding a holding chamber, and a heating element arrangement which is arranged in the heating device and contains a heat source for heating the holding chamber.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 3 illustrates a housing of an integrated circuit to be tested.

DETAILED DESCRIPTION

Figure 1:
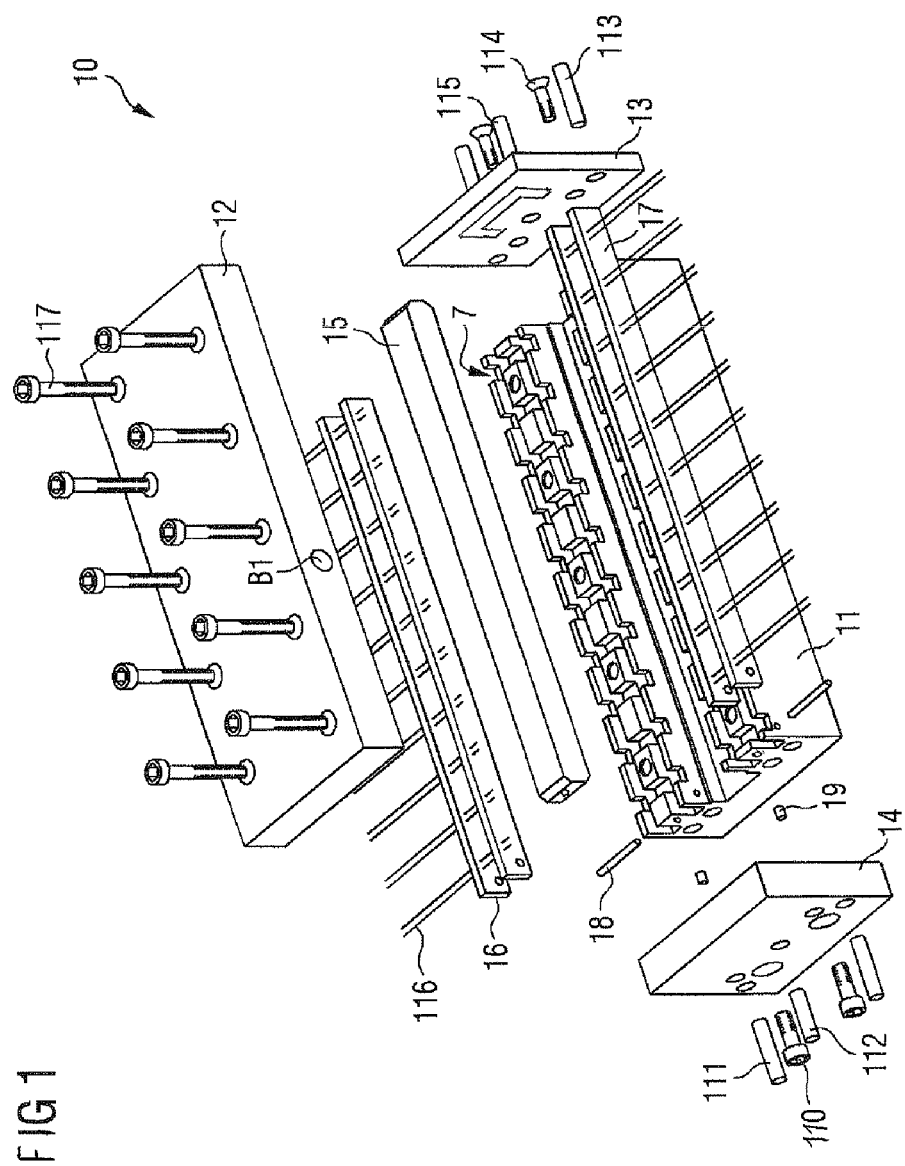
FIG. 1 illustrates an exploded illustration of an oven core.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment provides an improved simple heating device which operates in particular free of faults while at the same time having significantly more favorable procurement and operating costs and permits a homogeneous temperature of the element to be tested in its interior.

In one embodiment of the heating device according to the invention there is at least one recess in the inner casing. In the recess, an electrically conductive contact device is moveably arranged, i.e. is loosely mounted, in particular with a degree of play greater than, for example, 10 micrometers and less than, for example, 0.1 millimeters. Typically, there are a plurality of recesses, for example more than 10 recesses. The contact device or the contact devices are rigid in one embodiment so that a force from the outside can be transmitted via the contact device into the holding space and from there to a contact surface which is located on the circuit to be tested. There is then very secure electrical and mechanical contact between the circuit and contact device. The contact device can also have a plurality of contact surfaces for different connections of the circuit or of the component. The test circuit therefore no longer needs to be arranged on a circuit board but rather can be introduced into the heating device without an electrically conductive connection to the outside. Apart from the circuit housing there is only one contact between two different materials in the hot region, specifically the pressure contact between the contact pin and the connection of the circuit housing.

In a further embodiment, the contact device contains a contact pin or is composed of a contact pin. However, the contact pin is not necessarily slideable or pivotable along its longitudinal axis in the recess. In one embodiment, a straight contact pin is used. However, bent contact pins, for example contact pins bent along an arc as well as what are referred to as bending pins, are also possible. In another embodiment, the contact pin is mounted so as to be moveable, in particular pivotable, transversely with respect to its longitudinal axis.

In another embodiment, on the heating device there is a positioning device which, in a first working position, positions a contact face of the contact device in a first position in the holding chamber. In a second working position of the positioning device the contact face is positioned in a second position in the holding chamber or outside the holding chamber. The contact device can thus easily be moved manually or automatically between the two positions. The loading or unloading of the heating device is thus made easier. Alternatively, in the second position, the positioning device is detached from the contact device so that the contact device can, for example, be moved manually into an unloading position.

The first position is different from the second position, for example by more than 2 millimeters distance. In the first position, contact is made with an integrated circuit or an integrated component or a plurality of circuits or components in the holding chamber. In contrast, in the second position, contact is not made with the test components, or is only made in a loosely mechanical fashion so that the holding chamber can be charged. The first position is usually located further into the interior of the holding chamber than the second position.

The positioning device can be equipped with a spring mounting for pressing the contact faces of the contact device against the test modules. However, it is also alternatively possible to use clamping or some other way of securing, for example by screwing tight, wedging etc.

In another embodiment, the positioning device contains a spring element which moves the contact device into the first position, the spring element being arranged outside the holding chamber. The contact force can be satisfactorily predefined by the spring element. The spring element is arranged outside the inner casing so that its spring force is not adversely affected by the constant heating and cooling of the heating device. As a result, there is in particular only a mechanical contact in the hot zone, i.e. in particular in the holding chamber and the inner casing.

The spring element is, for example, a metal spring such as a spring pin, spiral spring, helical spring, etc. However, other sprung materials are also used since the spring is only subjected to the ambient temperature of, for example, 20° C. (degrees Celsius) or a slightly heated ambient temperature of less than 60° C. As a result, plastic materials, rubber materials and the like are also suitable for manufacturing the spring element.

The spring element on the contact device permits the contact force to be satisfactorily predefined so that both the mechanical connection between the contact device and the circuit and the electrical connection are very good.

In one embodiment, the spring element is a spring pin which is arranged transversely with respect to the longitudinal axis of the contact pin. In one embodiment, the longitudinal axis of the spring pin is at an angle between 80 and 100 degrees with respect to the longitudinal axis of the contact pin. Spring pins are very simple components with nonlinear spring properties which give rise to a spring force which relates nonlinearly to the travel by which the spring force is moved or pivoted.

In a further embodiment, there is an electrically insulating fitting on the contact pin. On the fitting there is a bearing face on which the spring pin is arranged in the first position. The bearing face is part of a recess into which the spring pin engages. When the positioning device moves into the first position, the spring pin is pressed onto this bearing face. Side walls in the recess guide the spring pin and, for example, prevent the spring pin from slipping out laterally. In one embodiment, the recess also has a second bearing face, the second bearing face lying opposite the first bearing face. When the positioning device moves into the second position, the spring pin presses against the second bearing face and pulls the contact face or another contact device out by a certain amount, or pulls it out completely from the holding chamber.

In one embodiment, there is a holding device, on which the spring element is arranged or held, in the positioning device. The holding device is, in particular, mounted in a pivotable or slideable fashion and thus predefines the direction of movement for the spring element.

In a further embodiment, there is a further spring element which prestresses the holding device. For example, the positioning device moves, owing to this mechanical prestress, into the first position or would move into the first position if an adjusting element, for example a screw, does not counteract the prestress. The prestress makes the positioning easier.

In one embodiment there are a plurality of spring elements which are arranged in the holding device and which each move one contact device. For example, there are more than 10 spring elements. In one embodiment, less than 100 spring elements are used per holding device. As a result, it is possible to apply or detach a plurality of contacts with one positioning movement. Manual positioning movements provide the advantage that there is no need for motors, gear mechanisms etc. which would lead to a complicated design. Furthermore, during manual activation the heating device can be checked for obvious damage, clamping contact pins etc.

In a further embodiment, the heating device additionally contains an outer casing which surrounds the inner casing. In the outer casing there is a further recess in which the contact device is moveably arranged, in particular with play, see the values given above. In one embodiment there is a distance or intermediate space between the inner casing and outer casing. The contact device can thus be mounted better, specifically on the inner casing and outer casing. This leads to more precise positioning.

In one embodiment, the spring element or spring elements and the further spring elements are arranged outside the outer casing and thus in a region which is not excessively heated. The service life of the spring elements is thus not adversely affected by heat.

In a further embodiment, a thermally insulating material is located between the inner casing and the outer casing. The insulating material in particular keeps the heat away from spring elements located on the outside and increases the energy efficiency of the heating device.

In one embodiment, one region of the inner casing is arranged between the holding chamber and the heating element arrangement. This structural measure leads to better homogeneity or uniformity of distribution of the temperature on the inside of the casing. While there are large temperature differences, for example, on heating wires and also on the surface of heating elements which contain heating wires, the region brings about temperature equalization.

In a further embodiment, the inner casing contains a material with a coefficient of thermal conductivity greater than 0.1 W cm$^{-1}$ K$^{-1}$ or greater than 1 W cm$^{-1}$ K$^{-1}$ or is composed of such a material, in particular of a metallic material, such as aluminum or copper. This measure also leads to an improvement in the homogeneity of the temperature on the inner wall of the inner casing, in particular in combination with the inner casing region between the holding chamber and heating element.

In one embodiment, the region of the inner casing has a thickness greater than 0.8 cm or greater than 1 cm (centimeters). In one embodiment this thickness is present in particular throughout the entire region. This also brings about more uniform distribution of the temperature.

In another embodiment, the inner casing also has a thickness greater than 0.8 cm or greater than 1 cm outside the region. This thickness is present everywhere on the inner casing apart from recesses for contact devices, charging and temperature measurement. Once again more uniform distribution of the temperature is brought about.

In particular if all the aforethe measures are combined in order to improve the uniformity of temperature, a maximum temperature difference which is less than 1 Kelvin, or, for example, T=300° C. (degrees Celsius) in absolute terms is achieved on the entire inner wall or on over 90 percent of the surface of the inner wall of the holding chamber. This value is therefore also present within the holding chamber if there are only negligible heat sinks and heat sources.

In a further embodiment, the heating element arrangement contains two heating elements which are arranged on opposite sides of the holding chamber. Even though the holding chamber is surrounded by heating elements on only two sides, the aforethe temperature homogeneity can nevertheless be achieved by virtue of the abovementioned structural measures. In order to achieve this, in one embodiment the sides which are not provided with heating elements are embodied in a highly shortened form, for example less than half or less than a third, compared to the sides on the wall of the holding chamber which are provided with heating elements. The electrically conductive contact devices can easily be arranged on the sides without heating, which gives rise to a particularly simple design of the heating device.

In a further embodiment, the heating element arrangement contains resistance heating elements. This leads to a particularly simple design. For example, PTC thermomisters are used to provide simple protection against overheating. In one embodiment, the resistance heating elements are of flat design and thus easy to fabricate. The flat resistance heating elements also bear satisfactorily on planar surfaces which are easy to fabricate.

In one embodiment, the volume of the holding chamber is less than the volume of the inner casing. In particular, the volume of the holding chamber is less than 50 percent of the volume of the inner casing. A block-shaped or very compact inner casing with uniform temperature distribution is obtained. As a result, the heating device also requires less actuating area.

For example, an upper part of the core and a lower part of the core (plate, shaped part) are connected to one another by a plurality of screws. More screws are used than would be necessary for purely mechanical cohesion because here the emphasis is also on a good thermal connection of all the core parts. In particular, the surfaces which come together should be satisfactorily planar, for example surface precision better than ±0.05 mm. The same applies to the front part and back part of the core.

In one embodiment, the inner casing contains a plate in the form of a right parallelepiped. The plate contains at least 30 percent by volume of the material of the inner casing. The plate gives rise to a block-shaped inner casing composed of few components. A plate is particularly economical compared to a shaped part with recesses. In one embodiment, for attaching the plate there are only recesses in the plate.

In one embodiment a shaped part in the form of a right parallelepiped which adjoins the plate is present in the inner casing. The shaped part contains at least 30 percent by volume of the material of the inner casing. This also leads to a compact inner casing. In one embodiment, the inner casing contains, apart from screwed connections or pin connections, only the plate, the shaped part and two plates which are small compared to the plate, on the sides with the smallest surface. The shaped part is, for example, a cast part, a part which is manufactured by metal cutting processing or a part which is manufactured in some other shaping fashion.

In a further embodiment, the shaped part contains a recess which extends in its longitudinal direction and in which an electrically insulating material is arranged. In one embodiment, the recess and/or the electrically insulating material are matched in their width to the housing of the circuit to be tested. The width of the electrically insulating material is thus, for example, in the range from 0.1 mm to 1 mm less than the width of the circuit housing. In particular, the width of the insulating material is also less than the width of the recess (for example in the range from 0.2 mm to 2 mm) so that a space is produced for connecting legs of the circuit.

In a further embodiment, the shaped part contains a recess which extends transversely with respect to its longitudinal direction and in which the contact device is arranged.

In a further embodiment, the inner casing has an extent of less than 10 cm in at least one direction or in at least two directions at an angle of 90 degrees with respect to one another. In one embodiment, the maximum extent of the inner casing is less than 30 cm. As a result, the outer casing can also be embodied with a maximum dimension less than, for example, 35 cm. Heating devices are produced which can be installed manually in shelves in a way which is very space-saving and yet they are accessible at all times.

In one embodiment, the heating device has an electrically insulating rail which is enclosed by the inner casing. This rail bounds the holding chamber and thus decreases its volume. In one embodiment, the rail is located in the recess in the shaped part, which is provided in a longitudinal direction. The rail serves to hold an integrated circuit and is matched in its width and height to an IC (integrated circuit) housing.

In one embodiment, the heating device has at least one U-shaped loading and unloading opening and/or a U rail-shaped holding chamber. U rail-shaped means that a base in the form of a right parallelepiped and two limbs which point in the same direction are provided on longitudinal edges of the base. The limbs extend, for example, at an angle of 90 degrees with respect to the base. The height of the base is somewhat larger than the height of the housing of the circuit to be tested, but is, for example, less than 10 mm. The limbs are somewhat wider and somewhat longer than the connecting legs of the housing, for example with a width of less than 4 millimeters and length of the limbs of, for example, less than 8 millimeters.

Associated with this is a charging method in which the housings of the circuits to be tested are inserted into the heating device one after the other and without being connected to a carrier. During unloading, the heating device is, for example, tipped, as a result of which the circuits which are loosely mounted at this time slip out of the heating device. The modules can also be slid out, for example using a thin rod which is introduced via a relatively small opening which is formed opposite the charging opening.

In a holding chamber with a small volume, the temperature distribution is more uniform than in a large volume because temperature equalization processes occur more quickly. In one embodiment, which is implemented in particular independently of the embodiments, the volume of the holding chamber is only somewhat larger than the volume of the circuits to be tested when the heating device is fully loaded, in particular at maximum ten times as large or at maximum five times as large or at maximum three times as large.

Figure 2:
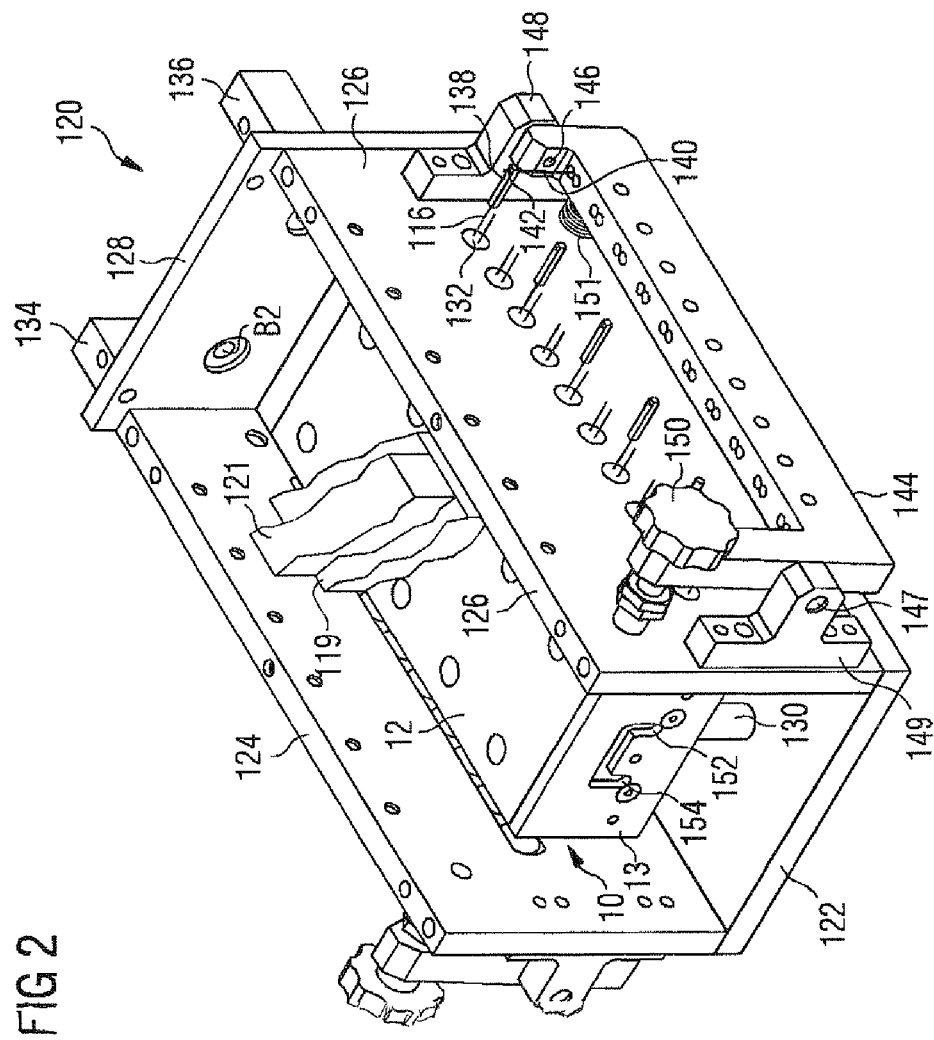
FIG. 2 illustrates a three-dimensional view of an oven.

In the text which follows, exemplary embodiments of the invention will be explained with reference to the appended drawings in which:

In the text which follows, an oven system is explained by way of example which is composed essentially of a core, two heating elements, an insulating means, an outer shell and a mechanism for the contact tips. FIG. 1 illustrates an exploded view of an oven core 10. In the assembled state, a solid aluminum body which has the form of a pure right parallelepiped on the outside and which ensures good temperature homogeneity in the interior is produced. A lower part 11 of the core contains in the center a continuous longitudinal milled-out portion into which a ceramic supporting bar 15 or supporting rail is inserted. For example the material "Macor" is used for the ceramic parts. Alternatively, for example the most cost effective but satisfactory material "Rescor 902" from Cotronics Corp. is used. The lower part 11 of the core also contains transverse milled portions 7 which are located transversely with respect to the longitudinal milled-out portion and through which in each case two contact pins project into the holding chamber 152, as illustrated in FIG. 2.

An upper part 12 of the core is embodied as an aluminum plate in the form of a right parallelepiped, and contains only bores, in particular for attaching attachment elements. Here, for example ten socket head cap screws 117 are used to attach the upper part 12 of the core to the lower part 11 of the core. In other exemplary embodiments, the core 10 is fabricated, for example, as a cast part.

The modules to be tested are inserted via an end-side terminating plate 13 and they run on the supporting bar 15 as far as a terminating plate 14 opposite the terminating plate 13. The terminating plate 13 has, for this purpose, a narrow U-shaped milled-out portion corresponding to the cross section of the modules to be tested. The terminating plates 13 and 14 are attached to the lower part 11 of the core using attachment elements, here using cylinder pins 113 and countersunk screws 114 or using socket head cap screws 110 and cylinder pins 111. The two threaded pins 112 and 115 secure the supporting bar 15 (the latter has corresponding bores in its end sides), and they therefore do not serve to connect the terminating plates to the lower part of the core. The threaded pins 19 clamp the cylinder pins 18.

Contact is made with the modules at the widened, upper ends of the connecting legs which protrude laterally from the module housing, as illustrated in FIG. 3. These contact faces measure, for example, approximately 1.3×2 mm (millimeters). The distance between the legs is constant. Contact pins, see for example a contact pin 116, extend from the outside through the outer shell and the wall of the core, and are therefore sufficiently precisely guided to meet the desired contact faces. For this purposes, in each case two ceramic bars, see guides 16 and 17, are let into further longitudinal milled portions on both sides of the lower part 11 of the core, the guides 16 and 17 having bores which match at the required locations and have the purpose of holding the contact pins 116. The further longitudinal milled portions are located transversely with respect to the transverse milled portions 7. In another exemplary embodiment, just one further longitudinal milled portion and one guide 16 is used on each side.

The zero point of the positioning for the modules is, for example, the rear terminating plate 14 or a cylinder pin 18 which is directly next to it and which secures the guides 16 in the longitudinal direction. The small dimensional tolerances both of the modules and of the guides 16, 17 ensure that contact is reliably made even with the module which is furthest away from the stop. With this structure, the extent of the aluminum body during heating does not influence the positioning of the contact pins.

The measurement of the core temperature is performed by a temperature sensor, here for example a platinum sensor, for example of the type PT100, which is inserted into a bore B1 in the upper part 12 of the core. The sensor is configured, for example, for application temperatures up to 500° C. and has connecting wires which are long enough to be able to be guided directly to a connecting plug of the oven. Contacts in the hot region are thus eliminated.

FIG. 2 illustrates a three-dimensional view of the oven 120 with the upper part and front part of the outer shell removed. Heating elements 119 are thin plates which rest over the entire surface of the upper and undersides of the core 10. They are manufactured, for example, in a prefabricated form in which, for example, a heating wire has been clamped in a serpentine shape. The shape is then filled with a ceramic sealing compound. After curing, a simple plate-shaped part is obtained. The two ends of the heating wire protrude at one end side and are then guided through the insulating means and bores B2 in the outer shell and clamped in only in the cold region.

An insulating layer 121, which is for example of equal thickness on all sides, encloses the oven core 10 together with the adjacent heating elements 119. For this purpose, for example a material with an extremely low thermal conductivity is used, which material is available in a plate form and can easily be cut to size, for example "microtherm block" from Microtherm International Ltd. For example 15 mm wall thickness or less is sufficient here to obtain the desired thermal insulation. On the equipping side, the insulation is attached, for example, to the corresponding plate of the outer shell and in order to change modules it is removed together with the latter as a closure lid and fitted on again. The free spaces between the core and shell are thus filled with the insulating plates. In the region of the contact pins 116, the insulating plates contain, for example, recesses for a plurality of contact pins, or a separate recess for each contact pin. This recess can also be filled with insulating material, for example with insulating padding.

The outer "packing" is a simple plate construction in the form of a right parallelepiped, composed of a base plate 122, a left-hand side wall 124 or side plate, a right-hand side wall 126 or side plate, a back wall 128 and the front plate and cover plate (not illustrated in FIG. 2). The cover plate has the same shape as the base plate. The front plate has the same outline as the back wall, but through its function as an oven closure it has a different design from the back wall 128. In other exemplary embodiments, the outer shell is fabricated, for example, as a cast part with a removable closure.

The positioning of the core 10 with respect to the shell is brought about by, for example, three or four ceramic stud bolts, see bolts 130, which are screwed to the shell bottom and engage in a loosely mounted fashion in milled-in depressions in the bottom of the core. Ceramic is used here in order to ensure there is no appreciable thermal coupling between the core 10 and shell, for example in particular base plate 122. However, in another exemplary embodiment, a bolt 130 made of another material, for example a steel bolt, with a small cross section is also used here. The different thermal expansion of the hot core 10 and of the shell which is colder in relation to it is allowed for and made possible with this way of mounting the core 10. The contact pins 116 are also introduced into the side walls 124, 126 of the shell, but relatively simple Polytetrafluoroethylene (PTFE) (e.g., Teflon™) parts are used here for example, see electrically insulating PTFE insulating disk 132 for the contact pin 116 and a further contact pin. The shell is also fitted with the connecting plug on the rear side. The connecting plug is not illustrated in FIG. 2, but the two attachment parts 134 and 136 for this connecting plug are illustrated, the connecting plug bringing about the disconnectable connection to loading/measuring electronics.

The parts which are attached to the sides of the shell will be described below. The contact pins 116 or contact tips on the contact pins 116 are lifted off from a module in order to change it and then pressed back onto the test module. In addition, there is also the other connection between the contact pin and connecting plug. The contact pins 116 are fitted at the outer end with an electrically insulating, firmly plugged-on pin head 138, for example made of PTFE. For example, a wire, which leads to the connecting plug at the rear, is simply soldered on directly in front of it. The contact pins 116 which are, for example, nickel plated or nickel plated and gold plated can be soldered very well. In addition, owing to the weak thermal conductivity of the thin contact pin, for example a steel pin, the soldering point is not appreciably hot so that it is secure.

A sprung pressure pin 140, for example another steel pin, makes pressing on the contact pins 116 easier, the pressure pin 140 engaging perpendicularly in a recess 142, for example a bore, at the outer end of the pin head 138. Each contact pin 116 is thus individually sprung. The entire row of the pressure pins 140 is arranged, in this case clamped, in a rotatable lever arm 144. The lever arm 144 is rotatably mounted by two pins 146, 147. The pins 146 and 147 are each attached to an angled attachment element 148 or 149, which attachment elements 148 and 149 are themselves attached to the side wall 126. The longitudinal axis of the pins 146 and 147 forms the pivot axis of the lever arm 144. The movement about the rotational axis of the lever arm 144 lifts the contact pins 116 off from the test module or presses them onto the test module again. In order to make the pivoting movement satisfactorily controllable, it is embodied with the screws 150 (illustrated in FIG. 2) with a rotary grip. One thread of the screw 150 is mounted rotatably in a thread which is arranged in the lever arm 144. The pressure force for the contact tips of the contact pins 116 is predefined by selecting the spring wire thickness and the pivoting range and can thus be varied within wide limits. A helical spring 151 is arranged, or a plurality of helical springs are arranged, between the lever arm 144 and the side wall 126 in order to prestress the lever arm 144. On the side wall 124 there is also a lever arm for pressing or detaching the contact pins on the left-hand side.

FIG. 2 also illustrates a U rail-shaped holding chamber 152 into which the circuits to be tested are inserted, for example using a feeder rail. The holding chamber 152 has a U-shaped opening 154.

FIG. 3 illustrates a housing 202 of an integrated circuit 200 to be tested. A test structure for a long-term test is, for example, sawn from a processed wafer and mounted in the chip housing 202, for example by bonding. The sawn small piece of wafer with the test structure is located under a, for example gold-colored, housing cover 204 which is also referred to as a lid. A connecting leg 206 has an upper flat section 208 and a lower section 210 with an approximately square cross section. A tapering section on which the circuit 200 or the housing 202 would be mounted when inserted into a printed circuit board is located between the flat section 208 and the section 210.

The contact face of the flat section 208 which is available for the contact pin 116 is here approximately 1.3 mm (millimeters) times 2 mm and is thus less than 2.5 mm times 2.5 mm. A distance A1 of the connecting legs from one another is constant, for example 2.54 mm. In the exemplary embodiment, a distance A2 between the connecting rows of the circuit 200 is 15.24 mm and is slightly more than the width of the supporting bar 15 and slightly less than the width of the holding chamber 154.

In other embodiments, other shapes of housing and other sizes of housing are used, for example with more or fewer connecting legs.

Here, only eight connections per housing 202 are used because there are two test structures per circuit 200 and in each case a four-point resistance measurement is carried out. On the left-hand connecting row, for example, only the two connecting legs which are located at one of the ends of the connecting row and two connecting legs which are adjacent to one another in the center of the left-hand connecting row are used. On the right-hand connecting row, connections are used which, in the exemplary embodiment, are offset toward the front by one connecting leg in relation to FIG. 2. In other exemplary embodiments, other connections or all the connections are used, in which case, for example, there is no offset of the connections used for the test.

In other exemplary embodiments there are numerous modifications, for example the lever arm 144 is embodied as a plate or frame. Instead of one adjustment screw 150 per lever arm, two adjustment screws are used. The lever arm is not pivoted but rather slid to and fro.

In each oven a plurality of rows of circuits are used, for example one next to the other or one on top of the other in relation to the illustration in FIG. 2. For example, one row of circuits is inserted into the oven upside down compared to the other row of circuits or in the same orientation as the other row of circuits. Ovens with more or fewer than five circuits per row are also used.

In other exemplary embodiments, the core is of cylindrical design, the heating elements also being adapted to this shape. Contact is made, for example, from above and below, if appropriate in addition to lateral contact. In particular, when there are other housings or connections on the housing. In other exemplary embodiments other tests are also carried out, for example tests of functionally capable integrated circuits such as memories, processors and the like.

To summarize, contact is made electrically and mechanically with the module legs directly with a spring loaded contact needle, for example a nickel plated and possibly gold plated spring steel pin. The pressure spring is seated here outside the oven body, i.e. in the cold region. These contact needles are used in a variety of ways in other test systems and are inexpensive in suitable embodiments. In the hot region there is only this one unavoidable contact. By the spring on the outside it is possible to implement a very high contact pressure which can also be maintained over years. The contact between the gold plated connecting leg and the tip is thus absolutely secure. The further connections to the electronics are all located in the cold region and are noncritical, for example a solder connected wire, a plug-type connection. There are thus no wear components or components which would be subject to aging.

The components of a group are seated in the interior of a thick walled aluminum right parallelepiped which is heated on two opposite sides by adjacent planar heating elements. The modules are inserted and removed via a small opening on one end side of the right parallelepiped. This oven core is surrounded on all sides by insulating means and this is in turn surrounded by a robust outer shell. One side of the shell is embodied so as to be removable in particular without disconnecting connections, in order to permit the oven to be equipped. The good thermal conductivity of, for example, aluminum or copper ensures that the oven core assumes a very homogeneous temperature despite the heating on only two sides. The modules in the interior therefore have the same ambient temperature on all sides for which reason precisely this temperature is evidently set in all the modules. The removal opening and the tip contacts constitute only small obstructions. First measurements on a prototype which has already been constructed yielded maximum temperature differences of +/−0.5 K at T=300° C. In addition, in the hot region there are no moveable parts which could wear. All the materials used in the hot region are permanently stable.

The oven system is only composed, for example, of less than 21 milled parts which are cost effective to manufacture and are composed, for example, of aluminum, a number of turned parts made of PTFE, insulating material and various inexpensive standard parts such as alignment pins, plugs, clamp handles, contact tips. In addition there are, for example, fewer than 6 ceramic workpieces, specifically for example 4 ceramic workpieces for guiding and positioning the contact pins, and a further ceramic part on which the modules are seated. Ceramic or some other heat resistant and electrically insulating material is necessary because of the electrical insulation necessary at these locations, in conjunction with high temperature resistance. In contrast, for example PTFE is sufficient for guiding the contact pins on the cold outer shell. For the ceramics, a cost effective material which can be processed with normal tools was selected. The oven system can thus be fabricated ⅓ more cost effectively than previously available commercial systems, even in a small series of, for example, less than 100 pieces. The robust design ensures defect-free operation even in a relatively tough laboratory operating mode. Since there are no parts, in particular in the hot region, which would be subject to aging or wear, maintenance costs or spare part costs are eliminated and the downtimes become a minimal. The service life of this system is very high, in particular longer than three years. Since with this system fault-free measurement results become possible for the first time, it is significant that the abovementioned expenditure on clarifying suspicious or incomprehensible measurement results is also reduced.

The oven system is built for a specific module housing, and if appropriate parts only have to be slightly adapted for other types (different number of pins, dimensions, shape). However, the question about different types of housing fades into the background if all the test structures are mounted in the same housing. There is then no reason for an unnecessary variety of types of housing.

The principle of the oven, of providing a surface of constant temperature around the modules, as a result of which the same temperature has to occur in the test specimens, is particularly effective if there are no heat sinks or heat sources, or negligible ones, in the test volume. For example, the contact tips do conduct to the outside heat from the modules, but the heat current which is drawn off as a result is very low owing to the poor thermal conductivity of, for example, steel pins and their small cross-sectional area. Furthermore, contact is made with all the modules in the group in an identical way so that there is only a small temperature offset which is constant for all the test specimens and could be allowed for. The test structures themselves are heat sources. When conductor track structures are loaded, for example in electromigration trials for which the system is mainly provided, a constant current is impressed in a resistor, i.e. there is a power loss which heats up the test structure. However, in one test group the overall power loss can be kept lower than 1 Watt, with typical values being in the range less than 100 mW, in particular at several 10 mW. This heat source is therefore also negligible.

Small oven systems such as the one illustrated have, under certain circumstances, a larger surface per module than larger ovens. In order to be able to keep the necessary heating power per module at a comparable level, better insulation is provided, for example. As a result, a relatively low cooling rate or a relatively long waiting time can come about until the circuits have cooled sufficiently to be exchanged after a trial has ended. However, since the average trial periods are, for example, 2 weeks, the contribution of the waiting time to the overall test time is, however, low and is far exceeded in existing systems by, in particular, the failure times due to maintenance and repair.

The following applies in particular to the invention and its embodiments:
  Heating on all sides for good temperature homogeneity. The test specimens are surrounded by a homogeneously temperature conditioned surface.
  Reduction of the number of electrical contacts per necessary connection in the critical hot region to the ideal number of one. This one contact is embodied with a maximum reliability, specifically in particular a tip contact with a high pressure force. Elimination of expensive and fault-prone systems with bases/printed circuit boards/plug-type connectors and instead selection of a different technical solution, specifically a contact device which can move relative to the test specimen in recesses.
  Robust construction from a small number of cost effective parts. No parts which are subject to wear, aging or could be damaged in normal operation. As a result, reduction of acquisition and maintenance costs, downtimes and engineers' work carrying out troubleshooting.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A heating device for testing integrated components, comprising:
    an inner casing arranged in the heating device, the inner casing surrounding a holding chamber configured to receive an integrated component for testing;
    a heating element arrangement which is arranged in the heating device external to the inner casing and contains a heat source for heating the holding chamber, the heating element arrangement comprising a plate-shaped heating element directly contacting a surface of the inner casing;
    a recess through the inner casing;
    an electrically conductive contact device moveably arranged in the recess, the contact device configured to directly electrically contact a contact surface of a circuit of an integrated component; and
    a positioning device which, in a first working position, positions a contact face of the contact device in a first position in the holding chamber, and which, in a second working position, positions the contact face in a second position in the holding chamber or outside the holding chamber, or becomes detached from the contact device.

2. The heating device as claimed in claim 1, wherein the contact device contains a contact pin or is a contact pin, the contact pin being slideable or pivotable along its longitudinal axis in the recess.

3. The heating device as claimed in claim 1, wherein the positioning device contains a spring element which moves the contact device into the first position, the spring element being arranged outside the holding chamber.

4. The heating device as claimed in claim 3, wherein the spring element is a spring pin which is arranged transversely with respect to the longitudinal axis of the contact pin.

5. The heating device as claimed in claim 4, comprising an electrically insulating fitting on the contact pin, and a bearing face on the fitting on which the spring pin is arranged in the first position.

6. The heating device as claimed in claim 3, comprising a holding device which is contained in the positioning device and on which the spring element is arranged.

7. The heating device as claimed in claim 6, distinguished by a further spring element which prestresses the holding device.

8. The heating device as claimed in claim 6, comprising a plurality of spring elements which are arranged in the holding device and which each move one contact device.

9. The heating device as claimed in claim 1, wherein the inner casing has an extent of less than 10 cm in at least one direction or in at least two directions at an angle of 90 degrees with respect to one another.

10. The heating device as claimed in claim 1, wherein the heating device has an electrically insulating rail which is enclosed by the inner casing, the rail configured to hold a plurality of integrated components.

11. The heating device as claimed in claim 1, wherein the heating device has at least one U-shaped loading and unloading opening or a U rail-shaped holding chamber.

12. The heating device as claimed in claim 1, wherein a volume of the holding chamber is only approximately at maximum ten times as large or at maximum five times as large as a volume of a heated material when the heating device is fully loaded.

13. A test system configured for testing integrated circuits, comprising:
    an inner casing arranged in a heating device, the inner casing surrounding a holding chamber configured to receive an integrated circuit for testing;
    a heating element arrangement which is arranged in the heating device and contains a heat source for heating the holding chamber;
    a plurality of recesses through the inner casing;
    a plurality of electrically conductive contact devices, each contact device moveably arranged in a recess of the inner casing, each contact device configured to directly electrically contact a contact surface of a circuit of the integrated circuit;
    an outer casing which surrounds the inner casing, and a plurality of recesses through the outer casing, each contact device moveably arranged in a recess of the outer casing such that a portion of each contact device extends outside the outer casing; and
    a positioning device outside the outer casing, the positioning device configured to, in a first working position, position a contact face of each of the plurality of contact devices in a first position in the holding chamber, and in a second working position, position the contact face of each of the plurality of contact devices in a second position in the holding chamber or outside the holder chamber, or become detached from the contact devices.

14. The system as claimed in claim 13, comprising a spring element arranged outside the outer casing.

15. The system as claimed in claim 13, comprising a thermally insulating material between the inner casing and the outer casing.

16. The system as claimed in claim 13, wherein one region of the inner casing is arranged between the holding chamber and the heating element arrangement.

17. The system as claimed in claim 16, wherein the inner casing contains a material with a coefficient of thermal conductivity greater than 0.1 W cm$^{-1}$ K$^{-1}$ or greater than 1 W cm$^{-1}$ K$^{-1}$ or is composed of such a material, in particular of a metallic material.

18. The system as claimed in claim 16, wherein the region of the inner casing has a thickness greater than 0.8 cm or greater than 1 cm.

19. The system as claimed in claim 16, wherein the inner casing has a thickness greater than 0.8 cm or greater than 1 cm outside the region.

20. The system as claimed in claim 13, wherein the heating element arrangement contains two heating elements which are arranged on opposite sides of the holding chamber and between the inner casing and the outer casing.

21. The system as claimed in claim 13, wherein the heating element arrangement contains resistance heating elements.

22. The system as claimed in claim 13, wherein a volume of the holding chamber is less than a volume of the inner casing.

23. A heating device for testing integrated components, comprising:
    an inner casing arranged in the heating device, the inner casing surrounding a holding chamber configured to receive an integrated component for testing;
    a heating element arrangement which is arranged in the heating device external to the inner casing and contains a heat source for heating the holding chamber;
    a recess through the inner casing;
    an electrically conductive contact device moveably arranged in the recess, the contact device configured to directly electrically contact a contact surface of a circuit of an integrated component; and a positioning device which, in a first working position, positions a contact face of the contact device in a first position in the holding chamber, and which, in a second working position, positions the contact face in a second position in the holding chamber or outside the holding chamber, or becomes detached from the contact device, and wherein the inner casing contains a plate in the form of a right parallelepiped, and the plate contains at least 30 percent by volume of the material of the inner casing.

24. The heating device as claimed in claim 23, wherein the inner casing contains a shaped part in the form of a right parallelepiped which adjoins the plate, and the shaped part contains at least 30 percent by volume of the material of the inner casing.

25. The heating device as claimed in claim 24, wherein the shaped part contains a recess which extends in its longitudinal direction, and an electrically insulating material is arranged in the recess.

26. The heating device as claimed in claim 24, wherein the shaped part has a recess which extends transversely with respect to its longitudinal direction and in which a contact device is arranged.

27. The heating device as claimed in claim 1, wherein the integrated component comprises a housing and connecting legs which protrude laterally from the housing, and wherein a connecting leg provides the contact surface of the circuit.

* * * * *